US008957521B2

(12) United States Patent
Nakamura et al.

(10) Patent No.: US 8,957,521 B2
(45) Date of Patent: Feb. 17, 2015

(54) MOUNTED STRUCTURE
(71) Applicant: Panasonic Intellectual Property Management Co., Ltd., Osaka (JP)
(72) Inventors: Taichi Nakamura, Osaka (JP); Hidetoshi Kitaura, Osaka (JP)
(73) Assignee: Panasonic Intellectual Property Management Co., Ltd., Osaka (JP)
( * ) Notice: Subject to any disclaimer, the term of this patent is extended or adjusted under 35 U.S.C. 154(b) by 0 days.
(21) Appl. No.: 14/114,337
(22) PCT Filed: Dec. 26, 2012
(86) PCT No.: PCT/JP2012/008324
§ 371 (c)(1),
(2) Date: Oct. 28, 2013
(87) PCT Pub. No.: WO2013/099243
PCT Pub. Date: Jul. 4, 2013

(65) Prior Publication Data
US 2014/0048942 A1 Feb. 20, 2014

(30) Foreign Application Priority Data
Dec. 27, 2011 (JP) ................................ 2011-284893

(51) Int. Cl.
*H01L 23/12* (2006.01)
*H01L 23/52* (2006.01)
(Continued)

(52) U.S. Cl.
CPC ............ *H01L 24/05* (2013.01); *B23K 35/0272* (2013.01); *B23K 35/22* (2013.01);
(Continued)

(58) Field of Classification Search
CPC ..... H01L 24/05; H01L 23/488; H01L 23/492; H01L 24/32; H01L 24/83; H01L 24/29; H01L 2224/48091; H01L 2924/00014; H01L 2224/73265; H01L 2224/32245; H01L 2224/48247; H01L 2924/00012; H01L 2924/01327; H01L 2924/00; H01L 2924/3025; H01L 2224/29111; H01L 2924/01083; H01L 2224/83192; H01L 2224/83101
USPC ........................................... 257/764, E23.028
See application file for complete search history.

(56) References Cited

U.S. PATENT DOCUMENTS 7,951,699 B2 * 5/2011 Iwasaki et al. ................ 438/613
8,418,910 B2 * 4/2013 Yamakami et al. .......... 228/56.3
(Continued)

FOREIGN PATENT DOCUMENTS

JP   2000-54189    2/2000
JP   2001-230351   8/2001
(Continued)

OTHER PUBLICATIONS

English translation of International Preliminary Report on Patentability and Written Opinion issued Jul. 10, 2014 in International (PCT) Application No. PCT/JP2012/008324.
(Continued)

*Primary Examiner* — Jarrett Stark
(74) *Attorney, Agent, or Firm* — Wenderoth, Lind & Ponack, L.L.P.

(57) ABSTRACT

A mounted structure includes an electrode of a substrate, an electrode of a semiconductor element, and a mounted layers for bonding the electrode of the substrate and the electrode of the semiconductor element, and the mounted layers includes: a first intermetallic compound layer containing a CuSn-based intermetallic compound; a Bi layer; a second intermetallic compound layer containing a CuSn-based intermetallic compound; a Cu layer; and a third intermetallic compound layer containing a CuSn-based intermetallic compound, and the above layers are sequentially arranged from the electrode of the substrate toward the electrode of the semiconductor element to configure the mounted layers.

7 Claims, 11 Drawing Sheets

(51) Int. Cl.
- *H01L 29/40* (2006.01)
- *H01L 23/00* (2006.01)
- *B23K 35/02* (2006.01)
- *B23K 35/22* (2006.01)
- *H01L 23/488* (2006.01)
- *H01L 23/492* (2006.01)
- *B23K 35/26* (2006.01)
- *B23K 35/30* (2006.01)
- *H01L 23/495* (2006.01)

(52) U.S. Cl.
CPC ............... *H01L 24/29* (2013.01); *H01L 24/83* (2013.01); *H01L 24/32* (2013.01); *H01L 23/488* (2013.01); *H01L 23/492* (2013.01); *B23K 35/264* (2013.01); *B23K 35/302* (2013.01); *B23K 35/0261* (2013.01); *H01L 2224/32245* (2013.01); *H01L 2224/48091* (2013.01); *H01L 2224/48247* (2013.01); *H01L 2224/73265* (2013.01); *H01L 2224/83101* (2013.01); *H01L 24/48* (2013.01); *H01L 2924/01327* (2013.01); *H01L 2924/01322* (2013.01); *H01L 2924/3025* (2013.01); *H01L 23/49513* (2013.01); *H01L 2224/04026* (2013.01); *H01L 2224/05639* (2013.01); *H01L 2224/05644* (2013.01); *H01L 2224/05647* (2013.01); *H01L 2224/05655* (2013.01); *H01L 2224/29083* (2013.01); *H01L 2224/29111* (2013.01); *H01L 2224/29139* (2013.01); *H01L 2224/29147* (2013.01); *H01L 2224/83192* (2013.01); *H01L 2224/83439* (2013.01); *H01L 2224/83447* (2013.01); *H01L 2224/8381* (2013.01); *H01L 2924/00014* (2013.01)
USPC .................................. 257/762; 257/E23.028

(56) References Cited

U.S. PATENT DOCUMENTS

| | | | | |
|---|---|---|---|---|
| 8,487,437 | B2* | 7/2013 | Elenius et al. | 257/750 |
| 8,559,092 | B2* | 10/2013 | Bugno et al. | 359/265 |
| 2003/0121959 | A1* | 7/2003 | Yamaguchi et al. | 228/256 |
| 2005/0221634 | A1* | 10/2005 | Hilty et al. | 439/70 |
| 2007/0001315 | A1 | 1/2007 | Yokoyama et al. | |
| 2011/0193231 | A1* | 8/2011 | Elenius et al. | 257/750 |
| 2011/0260275 | A1* | 10/2011 | Cho | 257/432 |
| 2012/0211549 | A1* | 8/2012 | Yamakami et al. | 228/256 |

FOREIGN PATENT DOCUMENTS

| | | |
|---|---|---|
| JP | 2009-290007 | 12/2009 |
| WO | 2005/020315 | 3/2005 |

OTHER PUBLICATIONS

International Search Report (ISR) issued Apr. 2, 2013 in International (PCT) Application No. PCT/JP2012/008324.

* cited by examiner

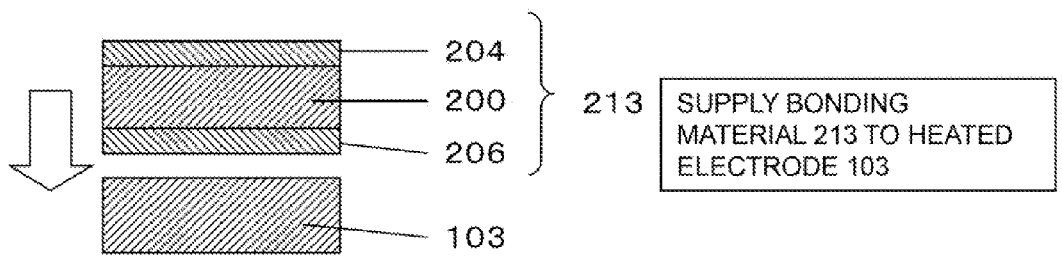
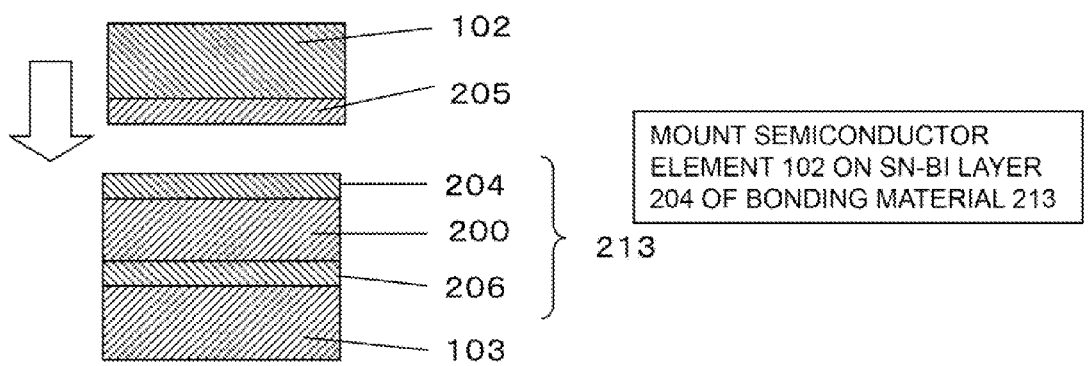
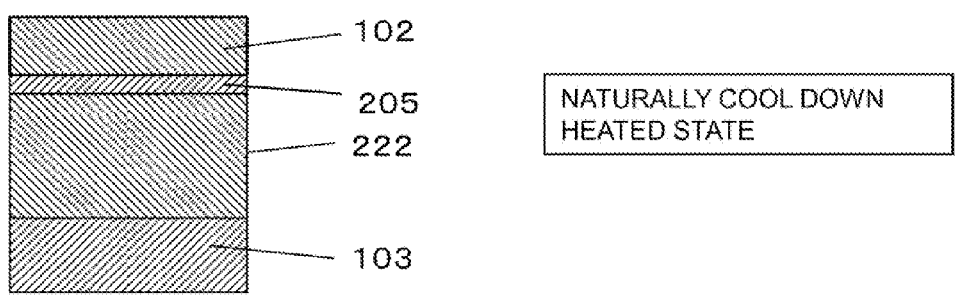

SUPPLY BONDING MATERIAL 223 TO HEATED ELECTRODE 103

MOUNT SEMICONDUCTOR ELEMENT 102 ON SN-BI LAYER 204 OF BONDING MATERIAL 223

NATURALLY COOL DOWN HEATED STATE

MOUNTED STRUCTURE

TECHNICAL FIELD

The present invention relates to an internal bonding of a semiconductor component. More particularly, the present invention relates to a mounted structure including a mounted layers for bonding an electrode of a semiconductor element and an electrode of a substrate in a power semiconductor module required to have superior mechanical characteristics and heat resistance.

DESCRIPTION OF THE RELATED ART

In an electronics packaging field, out of a concern of harm of lead and an increasing interest about the environment, a bonding desirably does not use lead. Then, as for a Sn—Pb eutectic solder which is a general solder material its alternative material has been developed and practically used.

Meanwhile, in the context of technical development of GaN and SiC serving as a next-generation high output device as alternatives to conventional Si, a Pb-free solder material having high heat resistance to a device heat generation temperature of 250° C. has been studied as a bonding material of the next-generation high output device.

As the Pb-free solder material having the high heat resistance, an Au-based solder material, Bi-based solder material, Zn-based solder material, and Sn-based solder material have been studied. As for the Au-based solder material, Au-20Sn having a melting point of 280° C., for example has been partially put to practical use, but since its main component is Au, a physical property of the material is hard, and a material cost is high, so that its use is limited to a small component, so that the Au-based solder material lacks versatility.

As for the Bi-based solder material, its melting point is in the vicinity of 270° C., so that there is no problem in view of a melting temperature, but the Bi-based solder material lacks ductility and heat conductivity. In addition, as for the Zn-based solder material, since its elastic modulus is too high, its mechanical characteristics and heat resistance are problematic in the internal bonding of the semiconductor component.

Meanwhile, as for the Sn-based solder material, a bonding material has been studied to have a high melting point by forming an AgSn compound and a CuSn combined with Ag and Cu which are widely used as electrode materials, and Sn, as intermetallic compound, as described in Japanese Patent Laid-open Publication No. 2009-290007 A.

FIG. 11 is a cross-sectional view of a conventional mounted structure disclosed in Japanese Patent Laid-open Publication No. 2009-290007 A. Referring to FIG. 11, a power semiconductor module has a mounted layers 604 between a power semiconductor element 602 and an electrode 603. In this mounted layers 604, the AgSn compound and the CuSn compound are used as its bonding material.

SUMMARY OF THE INVENTION

As for the bonding material containing the AgSn compound and the CuSn compound as described in Japanese Patent Laid-open Publication No. 2009-290007 A, heat resistance to the heat generation of the power semiconductor element can be provided due to the intermetallic compounds of Sn and Ag, and Sn and Cu. However, crack may be generated in the power semiconductor element, or an interface between the power semiconductor element and the mounted layers may be peeled off at the time of cooling down from 260° C. heated in a bonding process to room temperature.

It is considered that this is because ductility of the mounted layers is lost due to the intermetallic compound of Sn and Ag, or Sn and Cu, and the thermal stress caused by a linear expansion coefficient difference between the power semiconductor element and the electrode cannot be relaxed in the bonding process of the power semiconductor element.

Therefore, the mounted structure made of the bonding material in the Japanese Patent Laid-open Publication No. 2009-290007 A has assignments to achieve both of prevention of crack generation of the power semiconductor element or peeling between the power semiconductor element and the mounted layers due to the thermal stress, and heat resistance, in the bonding process.

Thus, it is an object of the present invention to provide a mounted structure of a power semiconductor module capable of showing heat resistance to heat generation of a power semiconductor element, and preventing peeling between a mounted layers and the power semiconductor element.

According to the present invention, a mounted structure includes:

an electrode of a substrate;
an electrode of a semiconductor element; and
a mounted layers that bonds the electrode of the substrate and the electrode of the semiconductor element,
wherein the mounted layers includes along a direction from the substrate toward the semiconductor element:
a first intermetallic compound layer containing a CuSn-based intermetallic compound;
a Bi layer;
a second intermetallic compound layer containing a CuSn-based intermetallic compound;
a Cu layer; and
a third intermetallic compound layer containing a CuSn-based intermetallic compound.

As described above, according to the mounted structure in the present invention, the mounted layers for bonding the electrode of the substrate and the electrode of the semiconductor element includes the first intermetallic compound layer containing the CuSn-based intermetallic compound, the Bi layer, the second intermetallic compound layer containing the CuSn-based intermetallic compound, the Cu layer, and the third intermetallic compound layer containing the CuSn-based intermetallic compound which are sequentially arranged from the electrode of the substrate toward the electrode of the semiconductor element. When the semiconductor element and the electrode of the substrate are bonded through this mounted layers, a stress can be relaxed by ductility of the Cu layer and low elasticity ($32 \times 10^9$, N/m$^2$) of the Bi layer, with respect to the thermal stress in the bonding process, so that it is possible to prevent the crack generation of the semiconductor element, or the peeling between the semiconductor element and the mounted layers.

In addition, the intermetallic compound layers, the Cu layer, and the Bi layer composing the mounted layers each have sufficient heat resistance, so that it is possible to ensure the heat resistance to heat generation of the semiconductor element at the time of an operation of the power semiconductor module. As a result, the mounted structure in the present invention can achieve both of the prevention of the crack generation of the semiconductor element or the peeling between the semiconductor element and the mounted layers due to the thermal stress, and the heat resistance, in the bonding process. Thus, the semiconductor element and the electrode can be bonded with high quality to improve bonding reliability.

BRIEF DESCRIPTION OF THE DRAWINGS

The present invention will become readily understood from the following description of preferred embodiments thereof made with reference to the accompanying drawings, in which like parts are designated by like reference numeral and in which:

FIGS. 6A to 6C are flowcharts of manufacturing steps of the mounted structure according to the second embodiment;

DETAILED DESCRIPTION OF THE EMBODIMENTS

Figure 1:
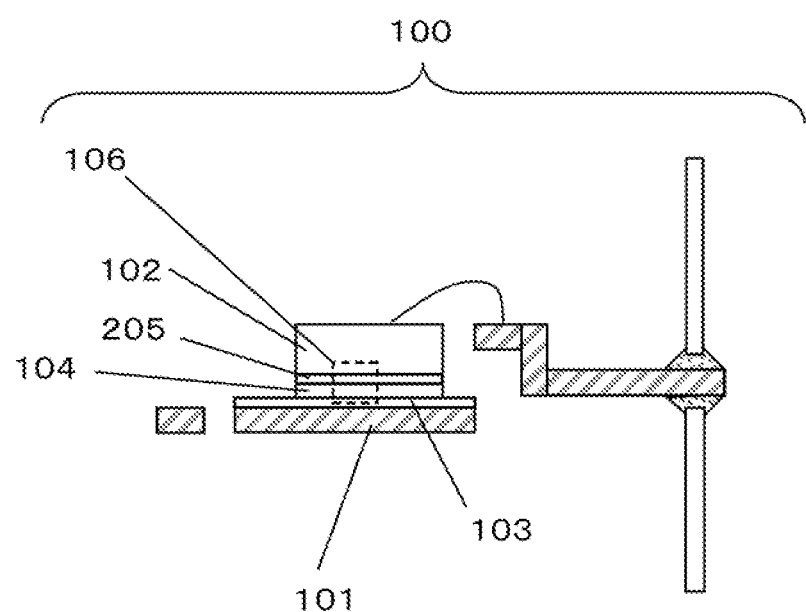
FIG. 1 is a cross-sectional view of a power semiconductor module bonded with a mounted structure according to a first embodiment.

A mounted structure according to a first aspect includes:
an electrode of a substrate;
an electrode of a semiconductor element; and
a mounted layers that bonds the electrode of the substrate and the electrode of the semiconductor element,
wherein the mounted layers includes along a direction from the substrate toward the semiconductor element:
a first intermetallic compound layer containing a CuSn-based intermetallic compound;
a Bi layer;
a second intermetallic compound layer containing CuSn-based intermetallic compound;
a Cu layer; and
a third intermetallic compound layer containing a CuSn-based intermetallic compound.

Further, as a mounted structure of a second aspect, in the first aspect, the mounted layers further includes:
a Bi layer; and
a fourth intermetallic compound layer containing a CuSn-based intermetallic compound, and
the above layers are sequentially arranged between the third intermetallic compound layer and the electrode of the semiconductor element.

Further, as a mounted structure of a third aspect, in the first or the second aspect, the CuSn-based intermetallic compound includes at least one intermetallic compound of $Cu_6Sn_5$ and $Cu_3Sn$.

Further, as a mounted structure of a fourth aspect, in any one of the first to third aspect, the Cu layer has a thickness of 6.2 µm or more.

Further, as a mounted structure of a fifth aspect, in the fourth aspect, a mount plane between the mounted layers and the electrode of the semiconductor element has an area of between 5 $mm^2$ and 100 $mm^2$.

Further, as a mounted structure of a sixth aspect, in the first or the second aspect, the first intermetallic compound layer contains the CuSn-based intermetallic compound, and includes an AgSn-based intermetallic compound.

Further, as a mounted structure of a seventh aspect, in the second aspect, the fourth intermetallic compound layer contains the CuSn-based intermetallic compound, and includes an AgSn-based intermetallic compound.

A bonding material to be inserted between an electrode of a substrate and an electrode of a semiconductor element according to an eighth aspect, the bonding material includes:
an Sn layer;
a Cu layer; and
Sn—Bi layer, and
the above layers are sequentially arranged to configure the bonding material, and
the Cu layer has a thickness equal to or more than thicknesses of the adjacent Sn layer and Sn—Bi layer.

A bonding material to be inserted between an electrode of a substrate and an electrode of a semiconductor element according to an eighth aspect, the bonding material includes:
a first Sn—Bi layer;
a Cu layer; and
a second Sn—Bi layer, and
the above layers are sequentially arranged to configure the bonding material, and
the Cu layer has a thickness equal to or more than thicknesses of the adjacent first and second Sn—Bi layers.

Hereinafter, a mounted structure and a bonding material according to each embodiment will be described reference to the drawings. In addition, substantially the same member is marked with the same reference sign in the drawings.

First Embodiment

FIG. 1 is a cross-sectional view of a power semiconductor module 100 bonded with a mounted layers 104 according to a first embodiment. This power semiconductor module 100 includes a substrate 101, and a semiconductor element 102 bonded to an electrode 103 provided on the substrate 101 through the mounted layers 104. In addition, a mounted structure 106 includes an electrode 205 of the semiconductor element 102, the mounted layers 104, and the electrode 103.

Figure 2A:
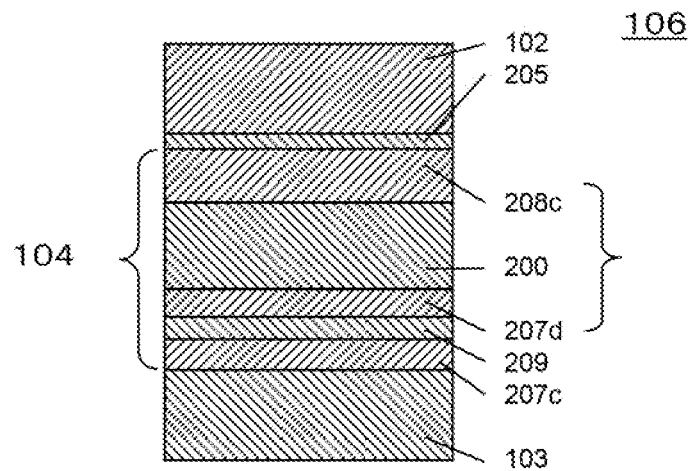
FIG. 2A is a cross-sectional view showing a detailed cross-sectional structure of the mounted structure according to the first embodiment.
Figure 2B:
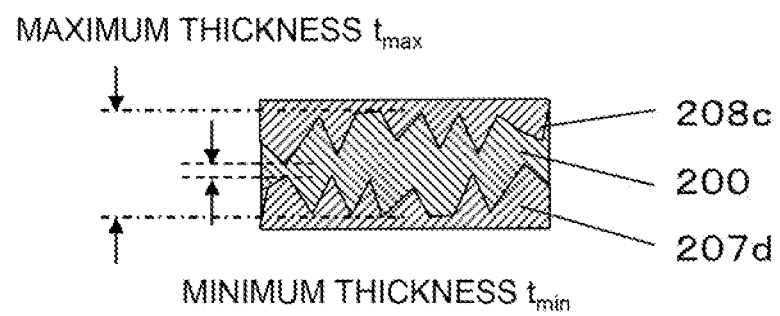
FIG. 2B is an enlarged cross-sectional view of a Cu layer in FIG. 2A.

Next, this formed mounted structure 106 will be described in detail with reference to FIG. 2A and FIG. 2B, FIG. 2A is a cross-sectional view showing a detailed cross-sectional structure of the mounted structure 106. This mounted structure 106 includes the electrode 103, the electrode 205 of the semiconductor element 102, and the mounted layers 104 for bonding the electrode 103 and the electrode 205. The mounted layers 104 is provided in such a manner that a first intermetallic compound layer 207c containing a CuSn-based intermetallic compound, a Bi layer 209, a second intermetallic compound layer 207d containing a CuSn-based intermetallic compound, a Cu layer 200, and a third intermetallic compound layer 208c containing a CuSn-based intermetallic compound are sequentially arranged from a side of the electrode 103 toward a side of the electrode 205 of the semiconductor element 102. In addition, FIG. 2B is an enlarged cross-sectional view of the three layers in FIG. 2A. As shown in FIG. 2B, a boundary surface between the second intermetallic compound layer 207d and the Cu layer 200, and a boundary surface between the third intermetallic compound layer 208c and the Cu layer 200 are not flat surfaces but concave-convex surfaces. Therefore, it is considered that the Cu layer 200 sandwiched between the second intermetallic compound layer 207d and the third intermetallic compound layer 208c has thicknesses ranging from a minimum thickness $t_{min}$ to a maximum thickness $t_{max}$.

As shown in FIG. 2A and FIG. 2B, the mounted structure 106 is characterized by having the layer-shaped Cu layer 200 sandwiched between the second and third intermetallic compound layers 207d and 208c, and the layer-shaped Bi layer 209 sandwiched between the first and second intermetallic compound layers 207c and 207d, in the mounted layers 104 for bonding the electrode 103 and the electrode 205 of the semiconductor element 102. Because of such laminated structure, each of the layers 207c, 209, 207d, 200, and 208c in the mounted layers 104 has sufficient heat resistance, and ductility in the mounted layers 104 can be ensured by the layer-shaped Cu layer 200 sandwiched between the second and third intermetallic compound layers 207d and 208c. In addition, stress relaxation is provided by a low-elasticity metal layer of the layer-shaped Bi layer 209 sandwiched between the first and second intermetallic compound layers 207c and 207d. The reason for those will be described below. As described above, the mounted structure 106 can achieve both of the heat resistance, and the stress relaxation due to the ductility of Cu and the low elasticity of Bi with respect to thermal stress, in the bonding process. Especially, in this mounted structure 106, since the ductility is provided with respect to the thermal stress, it is possible to prevent crack generation of the semiconductor element 102, and peeling between the semiconductor element 102 and the mounted layers 104.

<Method for Manufacturing Mounted Structure>

Figure 3A:
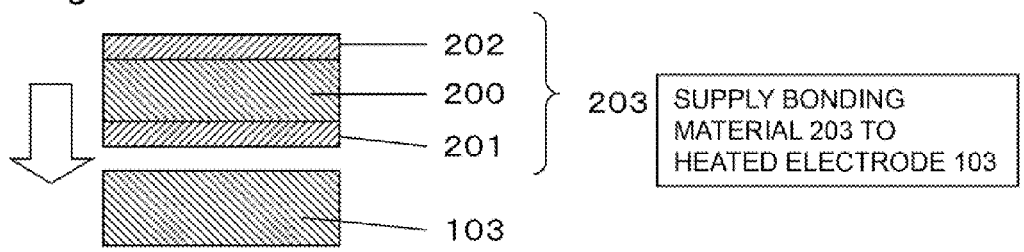
FIGS. 3A to 3C are flowcharts of manufacturing steps of the mounted structure according to the first embodiment.
Figure 3B:
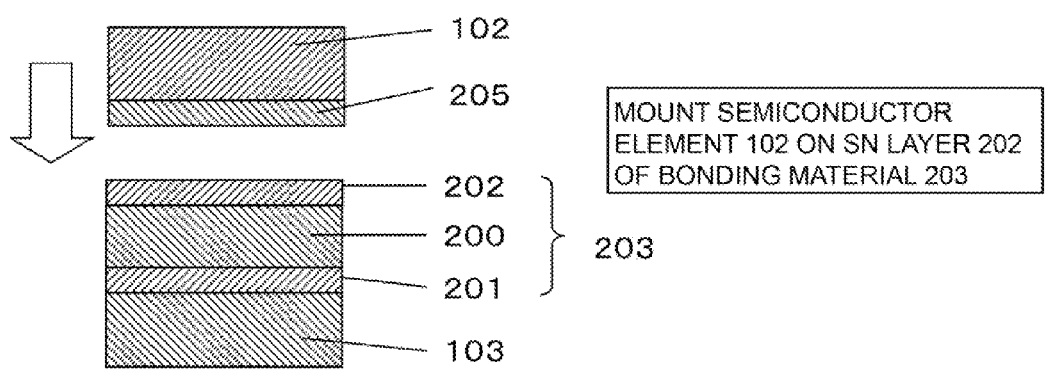
Figure 3C:
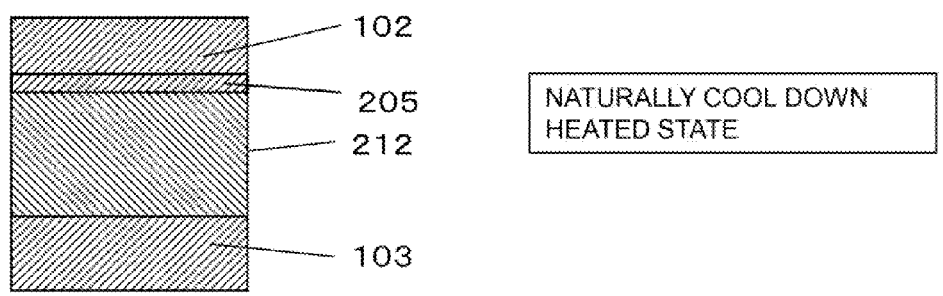

FIGS. 3A to 3C are flowcharts of manufacturing steps of the mounted structure in the first embodiment. FIG. 3A is a cross-sectional view showing a step of preparing a bonding material 203, and a step of supplying the bonding material 203 onto the electrode 103. FIG. 3B is a cross-sectional view showing a step of mounting the semiconductor element 102 on a Sn layer 202 of the bonding material 203. FIG. 3C is a cross-sectional view showing a step of obtaining a mounted layers 212 through natural cooling after FIG. 3B.

(1) First, as shown in FIG. 3A, the bonding material 203 is prepared in such a manner that an Sn—Bi layer 201, the Cu layer 200, and the Sn layer 202 are sequentially arranged. The bonding material 203 has the Cu layer 200 having a thickness of 50 μm as a center layer, and the Sn—Bi layer 201 of Sn-58 wt % Bi (hereinafter, simply referred to as Sn—Bi) having a thickness of 10 μm formed on a lower surface of the Cu layer 200 in a thickness direction, and the Sn layer 202 having a thickness of 10 μm formed on an upper surface of the Cu layer 200, for example. In addition, the thicknesses are just one example, and not limited to the above values. In addition, the composition of Sn—Bi preferably falls within a variation range of ±5 wt % or less with respect to an eutectic composition, in order to ensure wettability at the time of melting and make the Sn—Bi layer remain as a single layer after the bonding. The Sn—Bi layer 201 can be provided by electrolytic plating or non-electrolytic plating on the lower surface of the Cu layer 200. Preferably, the Sn—Bi layer 201 can be provided by the electrolytic plating. In addition, the Sn layer 202 can be also provided by the electrolytic plating or non-electrolytic plating. Preferably, the Sn layer 202 can be provided by the electrolytic plating. In addition, the method for obtaining the bonding material having the Sn—Bi layer 201 on the back surface of the Cu layer 200 and the Sn layer 202 on the front surface is not limited to the above method, and the bonding material 203 may be configured by pressure-bonding Sn—Bi foil to a back surface of Cu foil, and pressure-bonding Sn foil to a front surface. Alternatively, the bonding material 203 may be configured by forming films of Sn—Bi and Sn on the back surface and the front surface of the Cu foil, respectively by a vacuum deposition method or dip method. Furthermore, the bonding material 203 may be configured by sequentially arranging the Sn—Bi layer 201 the Cu layer 200, and the Sn layer 202 on the electrode 103 by the vacuum deposition method, so that the step of supplying the bonding material 203 to the electrode 103 can be performed at the same time.

In addition, the Cu layer 200 of the bonding material 203 is preferably thicker than the Sn—Bi layer 201 and the Sn layer 202 sandwiching both surfaces of the Cu layer 200. Furthermore, the Cu layer 200 preferably has a thickness between 15 μm and 100 μm.

(2) Then, the bonding material 203 is supplied onto the electrode 103 (FIG. 3A). In supplying the bonding material 203 onto the electrode 103, the electrode 103 is to be previously heated. More specifically, the electrode 103 to be used includes Cu alloy heated to 280° C. in a nitrogen atmosphere containing 5% of hydrogen. As a result, when the bonding material 203 is supplied onto the electrode 103, wettability of the Sn—Bi layer 201 and the Sn layer 202 can be ensured in the bonding material 203.

In addition, it is preferable that Sn and Bi are molten at a temperature equal to or more than 270° C. which is a melting point of Bi with a view to increasing diffusion speed of Sn and Cu when Sn—Bi is melted. In this case, it has been actually confirmed that preferable wettability is provided in a range of heating temperatures of 270° C. to 290° C. Thus, in view of a temperature variation of a facility, the heating temperature is set at 280° C. which is a middle value, in an example which will be described below.

(3) Then, the semiconductor element 102 is mounted on the Sn layer 202 of the bonding material 203 (FIG. 3B). In mounting the semiconductor element 102 on the bonding material 203, similar to the step of supplying the bonding material 203 described above, the electrode 103 to be used is in the continuously heated state at 280° C. from the step of FIG. 3A, in the nitrogen atmosphere containing 5% of hydrogen.

The semiconductor element 102 to be used may include GaN, for example. Ire addition, the semiconductor element 102 to be used has a thickness of 0.3 nm and a size of 4 mm×5 mm. In addition, the Ag layer 205 having a thickness of 1 μm, for example is formed on the semiconductor element 102 as the electrode 205. Then, the semiconductor element 102 is mounted on the Sn layer 202 of the bonding material 203 supplied on the electrode 103, with a load of 50 gf to 150 gf so that the Ag layer 205 comes in contact with the Sn layer 202 of the bonding material 203.

(4) Then, after the semiconductor element 102 mounted on the bonding material 203 has been left for about 30 minutes while the electrode 103 is continuously heated at 280° C. from FIG. 3B, in the nitrogen atmosphere containing 5% of hydrogen 5%, the heating is stopped, and then natural cooling is started in the nitrogen atmosphere containing 5% of hydrogen (FIG. 3C). As a result, the mounted layers 212 for bonding the electrode 103 and the electrode 205 of the semiconductor element 102 is formed, and the mounted structure can be manufactured.

<Formation of Mounted Layers>

In addition, the formation of the mounted layers 212 for bonding the electrode 103 and the semiconductor element 102 of the mounted structure 106 will be described with reference to FIGS. 4A to 4C.

Figure 4A:
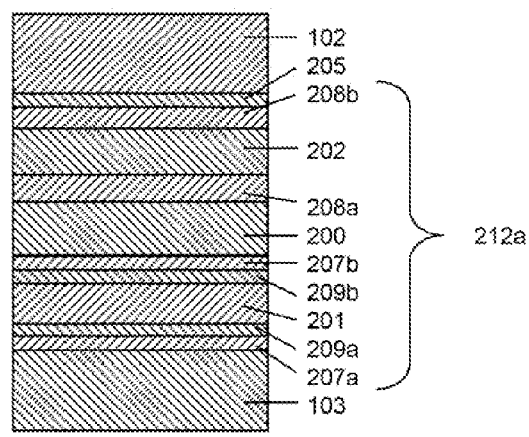
FIGS. 4A to 4C are schematic cross-sectional views showing detailed cross-sectional structures for forming a mounted layers in the manufacturing steps of the mounted structure according to the first embodiment.

FIGS. 4A and 48 are views showing a change in state of the mounted structure 106 between the steps of FIGS. 3B and 3C. FIG. 4C is a view showing the mounted structure 106 corresponding to FIG. 3C, and showing the mounted layers 212 in detail.

a) Formation of Intermetallic Compound Layers 207a and 207b, Bi Layers 209a and 209b, and Intermetallic Compound Layers 208a and 208b.

FIG. 4A is a schematic cross-sectional view just after the semiconductor element 102 has been mounted on the bonding material 203 supplied on the electrode 103 as described in FIG. 3. By heating the electrode 103, an intermetallic compound layer 208b containing an AgSn-based intermetallic compound is formed at an interface between the Ag layer 205 and the Sn layer 202 by a diffusion reaction. In addition, an intermetallic compound layer 208a of CuSn-based intermetallic compound is formed at an interface between the Sn layer and the Cu layer of the bonding material 203 by a diffusion reaction.

In addition, an intermetallic compound layer 207a of CuSn-based intermetallic compound is formed at an interface between the Sn—Bi layer 201 of the bonding material 203 and the electrode 103 by a diffusion reaction. Furthermore, an intermetallic compound layer 207b of CuSn-based intermetallic compound is formed at an interface between the Sn—Bi layer 201 and the Cu layer 200 of the bonding material 203 by a diffusion reaction. In addition, while Bi does not cause the diffusion reaction with Cu, Bi is deposited between the intermetallic compound layers 207a and 207b, and the Sn—Bi layer 201, so that Bi layers 209a and 209b are formed.

As a result of the above reactions, the mounted layers 212a includes the intermetallic compound layers 207a, the Bi layer 209a, the Sn—Bi layer 201, the Bi layer 209b, the intermetallic compound layer 207b, the Cu layer 200, the intermetallic compound layer 208a, the Sn layer 202, and the intermetallic compound layer 207b.

b) Disappearance of Sn—Bi Layer 201 and Sn Layer 202

Figure 4B:
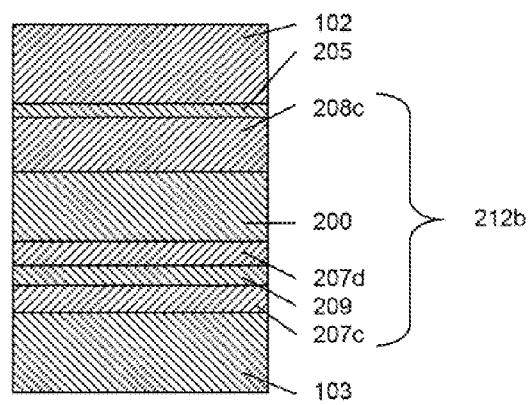

FIG. 4B is the schematic cross-sectional view of a state after 15 minutes has passed from FIG. 4A, that is, after 15 minutes has passed since the semiconductor element 102 was mounted on the electrode 103 through the bonding material 203. After having been left for 15 minutes under the condition, heated to 280° C., the intermetallic compound layers 208a and 208b, and the intermetallic compound layers 207a and 207b formed in FIG. 4A grow and the Sn layer 202 and the Sn—Bi layer 201 shown in FIG. 4A completely disappear.

More specifically, the intermetallic compound layers 208a and 208b which sandwiches the Sn layer 202 grow, so that the Sn layer 202 disappears. As a result, the third intermetallic compound layer 208c in which the AgSn compound is finely and uniformly diffused and mixed in the layer-shaped bulk CuSn-based intermetallic compound is formed. Especially, the CuSn-based intermetallic compound serving as a main phase in the third intermetallic compound layer 208c is $Cu_6Sn_5$ or $Cu_3Sn$, for example. In addition, AgSn-based intermetallic compound contained as a second phase is $Ag_3Sn$, for example. In addition, the composition of the intermetallic compound can be confirmed by EDX (Energy dispersion X-ray analysis) mounted on a scanning electron microscope (SEM) or the like.

In addition, the intermetallic compound layers 207a and 207b which sandwiches the Sn—Bi layer 201 grow, and the Sn—Bi layer 201 disappears, so that the first and second intermetallic compound layers 207c and 207d of the CuSn-based intermetallic compound and the Bi layer 209 are formed. In this case, the CuSn-based intermetallic compound corresponds to $Cu_6Sn_5$ or $Cu_3Sn$, for example.

Furthermore, in this case, the Cu layer 200 of the original bonding material 203 is partially changed to the second and third intermetallic compound layers 207d and 208c by the diffusion reaction, but the layer-shaped Cu layer 200 remains (refer to FIGS. 2A and 2B).

As a result of the above reactions, the mounted layers 212b includes the first intermetallic compound layer 207c, the Bi layer 209, the second intermetallic compound layer 207d, the Cu layer 200, and the third intermetallic compound layer 208c. This mounted layers 212b is apparently different in configuration from the mounted layers 212a.

In addition, the heating time is 15 minutes here, but the time is not limited to this, and the heating time may be within 45 minutes. As will be described below, when the heating time falls within 45 minutes, Cu of the electrode 103 can be prevented from being oxidized and changed in color.

c) Formation of Mounted Structure 106

Figure 4C:
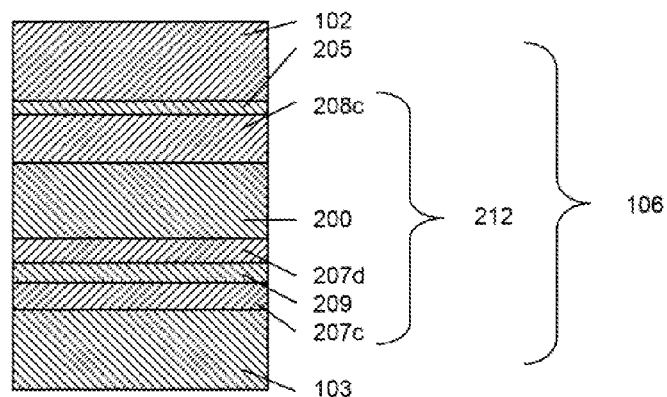

FIG. 4C is the schematic cross-sectional view of the mounted structure 106 completed after being naturally cooled down from the heated state in FIG. 4B to room temperature. By natural cooling from the heated state to room temperature, the mounted structure 106 in FIG. 40 can be obtained while the laminated state in FIG. 4B is maintained. In addition, the mounted layers 212 has roughly the same configuration as the mounted layers 212b, but when a high-temperature phase/low-temperature phase or the like depending on the temperature exists in each intermetallic compound, its composition partially changes in some cases.

For example, as shown in FIG. 40, the electrode 103 and the electrode 205 of the semiconductor element 102 are bonded by the mounted layers 212. The mounted layers 212 includes the third intermetallic compound layer 208c in which the AgSn intermetallic compound and the CuSn intermetallic compound are mixed, the Cu layer 200, the second intermetallic compound layer 207d of the CuSn intermetallic compound, the Bi layer 209, and the first intermetallic compound layer 207u of the CuSn intermetallic compound. In addition, the Cu layer 200 has an average thickness of 4.8 µm (average of measurements at N=10 points from observation of cross-sectional surfaces (5 points are measured in one cross-sectional surface, and measurements are taken in two cross-sectional surfaces)).

<Disappearance of Sn—Bi Layer and Sn Layer, and Remains of Layer-Shaped Cu Layer and Bi Layer Characterized in First Embodiment>

As shown in FIG. 4C, in the mounted structure 106 according to this first embodiment, among the Sn—Bi layer 201 the Cu layer 200, and the Sn layer 202 of the bonding material 203 described in FIG. 3, the Sn—Bi layer 201 and the Sn layer 202 disappear. Meanwhile, the layer-shaped Cu layer 200 sandwiched between the second and third intermetallic compound layers 207d and 208c remains, so that ductility can be obtained in the mounted layers 212 due to the Cu layer 200. In addition, the Bi layer 209 sandwiched between the first and second intermetallic compound layers 207c and 207d remains, and low elasticity can be obtained due to the Bi layer 209.

Meanwhile, hypothetically, when it is assumed that the Sn—Bi layer is left in the bonding material to keep the ductility of the mounted layers, contrary to the above, heat resistance is lost at a heat generation temperature of 250° C. of the semiconductor element at the time of the operation of the power semiconductor module because a melting point of Sn—Bi is as low as 139° C. That is, in the case where the Sn—Bi layer remains, when the Sn—Bi remains in a shape of a layer, for example, a defect is possibly generated such that the semiconductor element and the electrode are shifted in position at the heat generation temperature of 250° C. of the semiconductor element.

Therefore, the inventor of the present invention has thought of leaving the Cu layer and the Bi layer instead of Sn—Bi. In this case, since Ag and Cu are widely used for the electrode, it is possible to think that Ag and Cu on the electrode side are to be left. In a case where the mounted layers between the electrode of the semiconductor element and the electrode of the substrate is totally formed of the intermetallic compound layer, sufficient ductility cannot be kept in the mounted layers itself even when the Cu layer is left on the electrode side. Then, it is not possible to prevent the crack generation in the semiconductor element, and the peeling between the semiconductor element and the mounted layers, due to the thermal stress. Thus, as shown in FIG. 4C, the inventor of the present invention has come up with the idea that the ductility is provided in the mounted layers 212 by leaving the layer-shaped Cu layer 200 sandwiched between the second and third intermetallic compound layers 207d and 208c, and the low elasticity is provided by leaving the Bi layer 209, and reached the configuration of the first embodiment.

The reasons why the crack generation and the peeling are prevented in the mounted layers of the mounted structure are considered as follows.

As shown in FIG. 4C, melting points of the AgSn compound and the CuSn compound in the third intermetallic compound layer 208c of the mounted layers 212 are 480° C. or more and 415° C. or more, respectively. In addition, a melting point of the CuSn compound in the first and second intermetallic compound layers 207c and 207d is 415° C. or more. In addition, a melting point of the Cu layer 200 is 1000° C. or more, and a melting point of Bi layer 209 is 270° C. From the above, it is considered that the heat resistance is ensured because as for the heat resistance to 250° C. of heat generation at the time of the operation of the semiconductor element 102 when the power semiconductor module is used, the melting points of all components of the mounted layers 212 are higher than the above heat resistance criterion of 250° C.

In addition, according to the above configuration, the mounted layers 212 has the third intermetallic compound layer 208c in which the AgSn compound and the CuSn compound are mixed, the layer-shaped Cu layer 200, the second intermetallic compound layer 207d, the Bi layer 209, and the first intermetallic compound layer 207c. By bonding the semiconductor element 102 and the electrode 103 through the mounted layers 212, it is possible to achieve both of the prevention of the crack generation or the peeling between the semiconductor element and the mounted layers due to the thermal stress in the bonding process, and ensuring of the heat resistance to the heat generation of 250° C. of the semiconductor element at the time of the operation of the power semiconductor module, which could not be achieved by the conventional technique. As a result, the semiconductor element and the electrode of the substrate can be bonded with high quality, so that bonding reliability can be improved.

Thus, it is considered that the mounted structure in this first embodiment can solve the conventional problem.

Second Embodiment

Figure 5A:
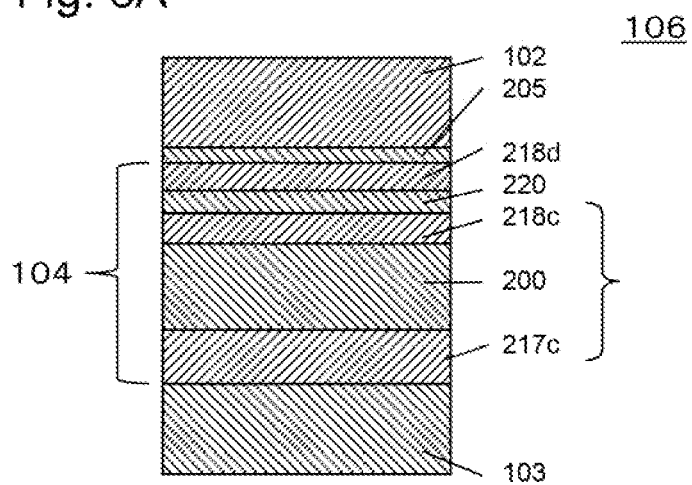
FIG. 5A is a cross-sectional view showing a detailed cross-sectional structure of a mounted structure according to a second embodiment.
Figure 5B:
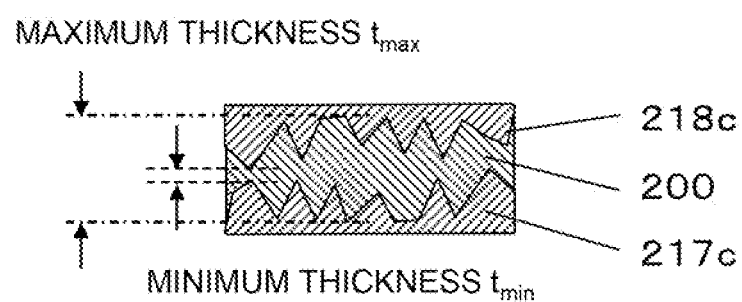
FIG. 5B is an enlarged cross-sectional view of a Cu layer in FIG. 5A.

FIG. 5A is a cross-sectional view showing a detailed cross-sectional structure of a mounted structure 106 according to a second embodiment. FIG. 5B is an enlarged cross-sectional view of a Cu layer 200 in FIG. 5A. FIGS. 6A to 6C are flowcharts of manufacturing steps of the mounted structure according to the second embodiment.

As shown in FIG. 5A, the mounted structure 106 according to the second embodiment includes an electrode 103, an electrode 205 of a semiconductor element 102, and a mounted layers 104 provided between them. As shown in the cross-sectional view in FIG. 6A, compared with the bonding material according to the first embodiment, a bonding material 213 used in the second embodiment is different in that an Sn—Bi layer 204 and an Sn layer 206 are arranged so as to be vertically reversed across the Cu layer 200, between the electrode 103 side and the electrode 205 of the semiconductor element 102. As a result, as shown in FIG. 5A, the formed mounted layers 104 includes a first intermetallic compound layer 217c containing a CuSn-based intermetallic compound, the Cu layer 200, a second intermetallic compound layer 213c containing a CuSn-based intermetallic compound, a Bi layer 220, and a third intermetallic compound layer 218d containing a CuSn-based intermetallic compound. The above layers are sequentially arranged from a side of the electrode 103 toward a side of the electrode 205 of the semiconductor element 102 to configure the mounted layers 104.

As shown in FIG. 5A, similar to the mounted structure according to the first embodiment, the mounted structure 106 according to this second embodiment is characterized by having the layer-shaped Cu layer 200 sandwiched between the first and second intermetallic compound layers 217c and 218c, and the layer-shaped Bi layer 220 sandwiched between the second and third intermetallic compound layers 218c and 218d, in the mounted layers 104 for bonding the electrode 103 and the electrode 205 of the semiconductor element 102. Because of such laminated structure, each of the layers 217c, 200, 218c, 220, and 218d in the mounted layers 104 has sufficient heat resistance, and ductility in the mounted layers 104 can be ensured by the layer-shaped Cu layer 200 sandwiched between the first and second intermetallic compound layers 217c and 218c. In addition, stress relaxation is provided by a low-elasticity metal layer of the layer-shaped Bi layer 220 sandwiched between the second and third intermetallic compound layers 218c and 218d. As described above, the mounted structure can achieve both of the heat resistance in a bonding process, and the stress relaxation due to the ductility of Cu and the low elasticity of Bi with respect to thermal stress. Especially, in this mounted structure 106, since the ductility is provided with respect to the thermal stress, it is possible to prevent crack generation of the semiconductor element 102, and peeling between the semiconductor element 102 and the mounted layers 104.

<Method for Manufacturing Mounted Structure>

FIGS. 6A to 6C are flowcharts of manufacturing steps of the mounted structure in the second embodiment.

Compared with the manufacturing steps of the mounted structure in the first embodiment, the manufacturing steps of the mounted structure in the second embodiment is different in that the bonding material 213 in which the Sn—Bi layer 204 is formed on a front surface and the Sn layer 206 is formed on a back surface of the Cu layer 200 is used. In addition, compositions, a forming method, and the like of the Sn—Bi layer 204 and the Sn layer 206 may be substantially the same as those in the first embodiment.

Third Embodiment

Figure 7A:
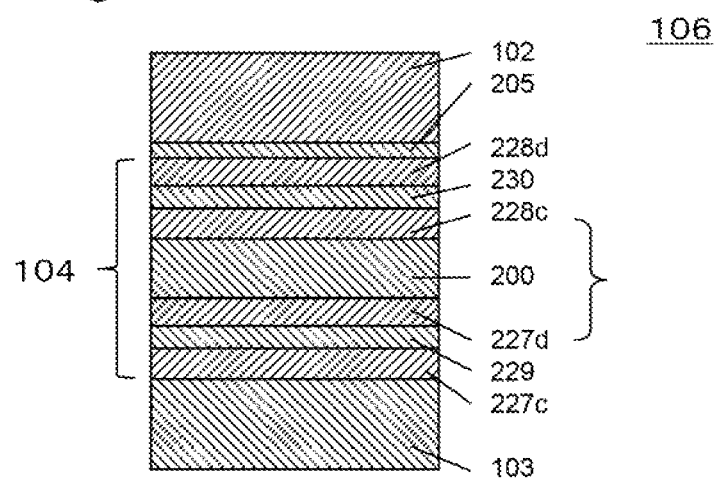
FIG. 7A is a cross-sectional view showing a detailed cross-sectional structure of a mounted structure according to an third embodiment.
Figure 7B:
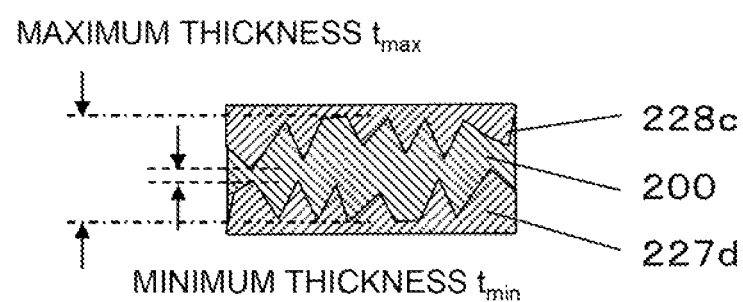
FIG. 7B is an enlarged cross-sectional view of a Cu layer in FIG. 7A.

FIG. 7A is a cross-sectional view showing a detailed cross-sectional structure of a mounted structure 106 according to a third embodiment. This mounted structure 106 includes an electrode 103, an electrode 205 of a semiconductor element 102, and a mounted layers 104 for bonding the electrode 103 and the electrode 205. The mounted layers 104 includes a first intermetallic compound layer 227c containing a CuSn-based intermetallic compound, a Bi layer 229, a second intermetallic compound layer 227d containing a CuSn-based intermetallic compound, a Cu layer 200, a third intermetallic compound layer 228c containing a CuSn-based intermetallic compound, a Bi layer 230, and a fourth intermetallic compound layer 228d containing a CuSn-based intermetallic compound. The above layers are sequentially arranged from a side of the electrode 103 toward a side of the electrode 205 of the semiconductor element 102 to configure the mounted layers 104. In addition, FIG. 7B is an enlarged cross-sectional view of the three layers in FIG. 7A. As shown in FIG. 7B, a boundary surface between the second intermetallic compound layer 227d and the Cu layer 200, and a boundary surface between the third intermetallic compound layer 228c and the Cu layer 200 are not flat surfaces but concavo-convex surfaces. Therefore, it is considered that the Cu layer 200 sandwiched between the second intermetallic compound layer 227d and the third intermetallic compound layer 228c has thicknesses ranging from a minimum thickness $t_{min}$ to a maximum thickness $t_{max}$.

As shown in FIGS. 7A and 7B, the mounted structure 106 is characterized by having the layer-shaped Cu layer 200 sandwiched between the second and third intermetallic compound layers 227d and 228c, the layer-shaped Bi layer 229 sandwiched between the first and second intermetallic compound layers 227c and 227d, and the layer-shaped Bi layer 230 sandwiched between the third and fourth intermetallic compound layers 228c and 228d, in the mounted layers 104 for bonding the electrode 103 and the electrode 205 of the semiconductor element 102. Because of such laminated structure, each of the layers 227c, 229, 227d, 200, 228c, 230, and 228d included in the mounted layers 104 has sufficient heat resistance, and ductility in the mounted layers 104 can be ensured by the layer-shaped Cu layer 200 sandwiched between the second and third intermetallic compound layers 227d and 228c. In addition, stress relaxation is provided due to low-elasticity metal layers of the layer-shaped Bi layer 229 sandwiched between the first and second intermetallic compound layers 227c and 227d, and the layer-shaped Bi layer 230 sandwiched between the third and fourth intermetallic compound layers 228c and 228d. The reason for those will be described below. As described above, the mounted structure 106 can achieve both of the heat resistance in a bonding process, and the stress relaxation due to the ductility of Cu and the low elasticity of Bi with respect to a thermal stress. Especially, in this mounted structure 106, since the ductility is provided with respect to the thermal stress, it is possible to prevent crack generation of the semiconductor element 102, and peeling between the semiconductor element 102 and the mounted layers 104.

<Method for Manufacturing Mounted Structure>

Figure 8A:
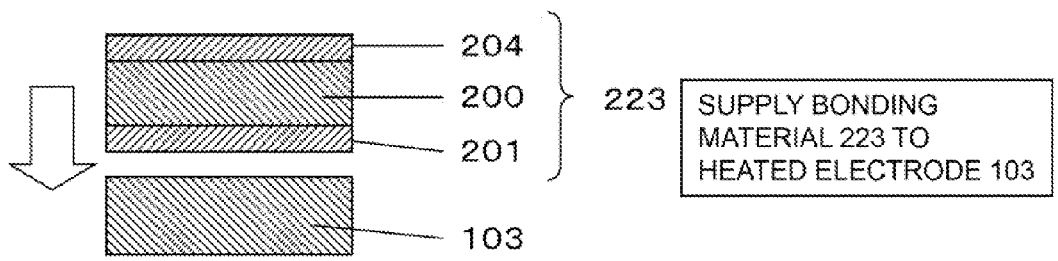
FIGS. 8A to 8C are flowcharts of manufacturing steps of the mounted structure according to the third embodiment.
Figure 8B:
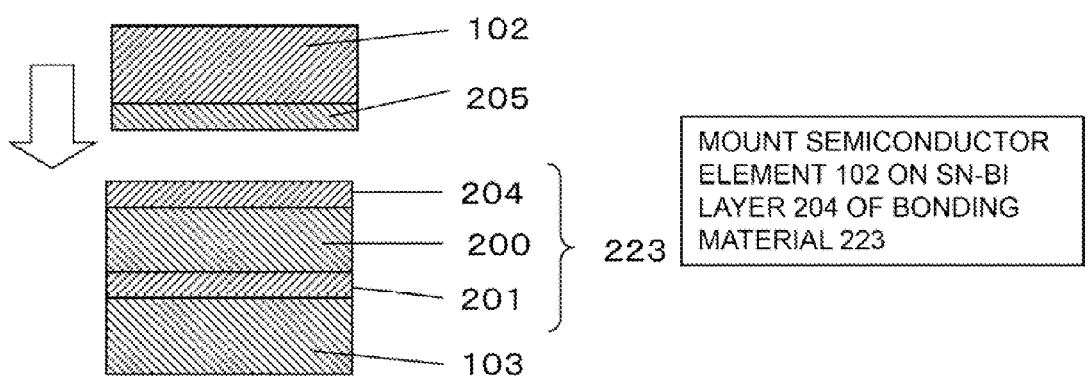
Figure 8C:
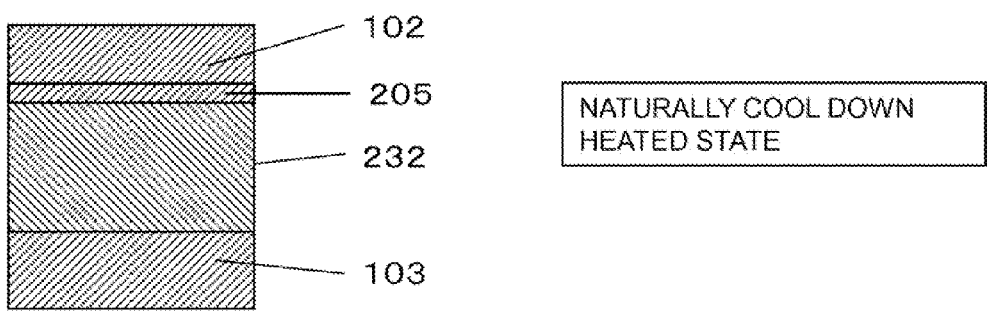

FIGS. 8A to 8C are flowcharts of manufacturing steps of the mounted structure in the third embodiment.

(1) First, a bonding material 223 is prepared in such a manner that a first Sn—Bi layer 201, the Cu layer 200, and a second Sn—Bi layer 204 are sequentially arranged. The bonding material 223 has the Cu layer 200 having a thickness of 50 μm as a center layer and, the first Sn—Bi layer 201 and the second Sn—Bi layer 204 of Sn-58 wt % Bi (hereinafter, simply referred to as Sn—Bi) having a thickness of 10 μm formed on upper and lower surfaces of the Cu layer 200 in a thickness direction, for example. In addition, the thicknesses are just one example, and not limited to the above values. In addition, the composition of Sn—Bi preferably falls within a variation range of ±5 wt % or less with respect to an eutectic composition, in order to ensure wettability at the time of melting and make it remain as a single layer after the bonding. The first and second Sn—Bi layers 201 and 204 can be provided by electrolytic plating or non-electrolytic plating on both surfaces of the Cu layer 200. Preferably, the first and second Sn—Bi layers 201 and 204 can be provided by the electrolytic plating. In addition, the method for obtaining the bonding material having the first and second Sn—Bi layers 201 and 204 on the front and back surfaces of the Cu layer 200 is not limited to the above method, and the bonding material 223 may be configured by pressure-bonding Sn—Bi foil on each of front and back surfaces of Cu foil. Alternatively, the bonding material 223 may be configured by forming films of Sn—Bi on the front and back surfaces of the Cu foil by a vacuum deposition method or dip method. In addition, the bonding material 223 may be configured by sequentially arranging the first Sn—Bi layer 201, the Cu layer 200, and the second Sn—Bi layer 204 on the electrode 103 by the vacuum deposition method, so that the step of supplying the bonding material 223 to the electrode 103 can be performed at the same time.

In addition, the Cu layer 200 of the bonding material 223 is preferably thicker than the first Sn—Bi layer 201 and the second Sn—Bi layer 204 provided on its both surfaces. Furthermore, the Cu layer 200 preferably has a thickness between 15 μm and 100 μm.

(2) Then, the bonding material 223 is supplied onto the electrode 103 (FIG. 8A). In supplying the bonding material 223 onto the electrode 103, the electrode 103 is to be previously heated. More specifically, the electrode 103 to be used includes Cu alloy heated to 280° C. in a nitrogen atmosphere containing 5% of hydrogen. As a result, when the bonding material 223 is supplied onto the electrode 103, wettability of the first Sn—Bi layer 201 and the second Sn—Bi layer 204 can be ensured in the bonding material 223.

In addition, it is preferable that Sn and Bi are molten at a temperature equal to or more than 270° C. which is a melting point of Bi with a view to increasing diffusion speed of Sn and Cu when Sn—Bi is melted. In this case, preferable wettability has been confirmed in a range of heating temperatures of 270° C. to 290° C. Thus, in view of a temperature variation of a facility, the heating temperature is set at 280° C. which is a middle value, in an example which will be described below.

(3) Then, the semiconductor element 102 is mounted on the second Sn—Bi layer 204 of the bonding material 223 (FIG. 8B). In mounting the semiconductor element 102 on the bonding material 223, similar to the step of supplying the bonding material 223 described above, the electrode 103 to be used is in the continuously heated state at 280° C. from the step of FIG. 8A, in the nitrogen atmosphere containing 5% of hydrogen.

The semiconductor element 102 to be used may include GaN, for example. In addition, the semiconductor element 102 to be used has a thickness of 0.3 mm, and a size of 4 mm×5 mm. In addition, the Ag layer 205 having a thickness of 1 μm, for example is formed on the semiconductor element 102 as the electrode 205. Then, the semiconductor element 102 is mounted on the bonding material 223 supplied on the electrode 103, with a load of 50 gf to 150 gf so that the Ag layer 205 comes in contact with the second Sn—Bi layer 204 of the bonding material 223.

(4) Then, after the semiconductor element 102 mounted on the bonding material 223 has been left for about 30 minutes while the electrode 103 is continuously heated at 280° C. from FIG. 8B, in the nitrogen atmosphere containing 5% of hydrogen. Then, the heating is stopped, and natural cooling is started in the nitrogen atmosphere containing 5% of hydrogen (FIG. 8C). As a result, the mounted layers 232 for bonding the electrode 103 and the electrode 205 of the semiconductor element 102 is formed, and the mounted structure can be manufactured.

<Formation of Mounted Layers>

In addition, the formation of the mounted layers 232 for bonding the electrode 103 of the mounted structure 106 and the semiconductor element 102 will be described with reference to FIGS. 9A to 9C.

Figure 9A:
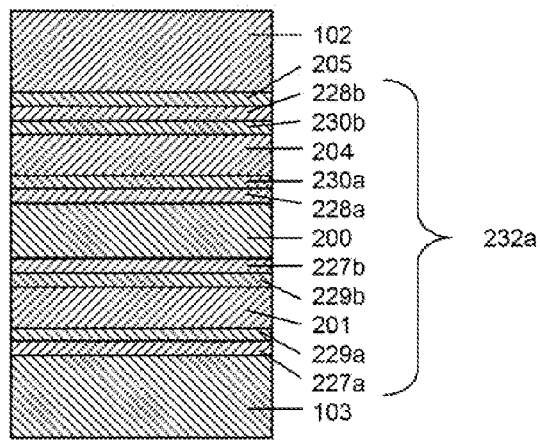
FIGS. 9A to 9C are schematic cross-sectional views showing detailed cross-sectional structures for forming a mounted layers in the manufacturing steps of the mounted structure according to the third embodiment.
Figure 9B:
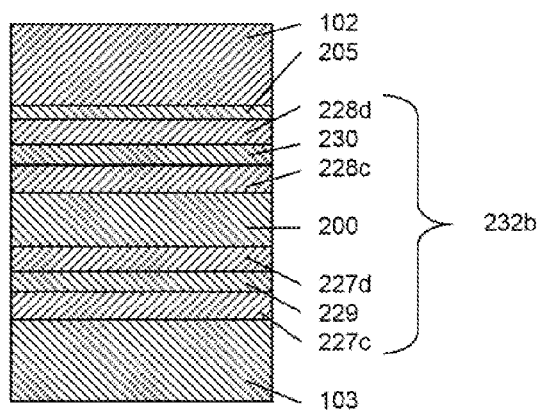

FIGS. 9A and 9B are views showing a change in state of the mounted structure 106 between the steps of FIGS. 8B and 8C. FIG. 9C is a view showing the mounted structure 106 corresponding to FIG. 8C, and showing the mounted layers 232 in detail.

a) Formation of Intermetallic Compound Layers 227a and 227b, Bi Layers 229a and 229b, intermetallic Compound Layers 228a and 228b, and 8i Layers 230a and 230b FIG. 9A is the schematic cross-sectional view just after the semiconductor element 102 has been mounted on the bonding material 223 supplied on the electrode 103 as described in FIG. 8. By heating the electrode 103, an intermetallic compound layer 228h containing an AgSn-based intermetallic compound is formed at an interface between the Ag layer 205 and the second Sn—Bi layer 204 of the bonding material 223 shown in FIG. 8 by a diffusion reaction. In addition, an intermetallic compound layer 228a containing a CuSn-based intermetallic compound is formed at an interface between the second Sn—Bi layer 204 and the Cu layer 200 of the bonding material 223 by a diffusion reaction. In addition, Bi which does not cause the diffusion reaction with Cu is deposited between the intermetallic compound layers 228a and 228b, and the second Sn—Bi layer 204, so that the Bi layers 230a and 230b are formed.

In addition, an intermetallic compound layer 227a of a CuSn-based intermetallic compound is formed at an interface between the first Sn—Bi layer 201 of the bonding material 223 and the electrode 103 by a diffusion reaction. Furthermore, an intermetallic compound layer 227b of a CuSn-based intermetallic compound is formed at an interface between the first Sn—Bi layer 201 and the Cu layer 200 of the bonding material 223 by a diffusion reaction. In addition, Bi which does not cause the diffusion reaction with Cu is deposited between the intermetallic compound layers 227a and 227b, and the first Sn—Bi layer 201, so that the Bi layers 229a and 229b are formed.

As a result of the above reactions, a mounted layers 232a includes the intermetallic compound layers 227a, the Bi layer 229a, the first Sn—Bi layer 201, the Bi layer 229b, the intermetallic compound layer 227b, the Cu layer 200, the intermetallic compound layer 228a, the Bi layer 230a, the second Sn—Bi layer 204, the Bi layer 230b, and the intermetallic compound layer 227b.

b) Disappearance of First and Second Sn—Bi Layers 201 and 204

FIG. 9B is the schematic cross-sectional view of a state after 15 minutes has passed from FIG. 9A, that is, after 15 minutes has passed since the semiconductor element 102 was mounted on the electrode 103 through the bonding material 223. After having been left for 15 minutes under the condition, heated to 280° C., the intermetallic compound layers 228a and 228b, and the intermetallic compound layers 227a and 227b formed in FIG. 9A grow and the second Sn—Bi layer 204 and the first Sn—Bi layer 201 shown in FIG. 9A completely disappear.

More specifically, the intermetallic compound layers 228a and 228h sandwiching the second Sn—Bi layer 204 grow, so that the second Sn—Bi layer 204 disappears. As a result, the fourth intermetallic compound layer 228d in which the AgSn compound is finely and uniformly diffused in the layer-shaped bulk CuSn-based intermetallic compound, the third intermetallic compound layer 228c of a layer-shaped bulk CuSn-based intermetallic compound, and the Bi layer 230 are formed. Especially, the CuSn-based intermetallic compound serving as a main phase in the fourth intermetallic compound layer 228d corresponds to $Cu_6Sn_5$ or $Cu_3Sn$, for example. In addition, the AgSn-based intermetallic compound contained as a second phase corresponds to $Ag_3Sn$, for example. In addition, the composition of the intermetallic compound can be confirmed by EDX (Energy dispersion X-ray analysis) mounted on a scanning electron microscope (SEM) or the like.

In addition, the intermetallic compound layers 227a and 227b which sandwiches the first Sn—Bi layer 201 grow, and the first Sn—Bi layer 201 disappears, so that the first and second intermetallic compound layers 227c and 227d of the CuSn-based intermetallic compound and the Si layer 229 are formed. In this case, the CuSn-based intermetallic compound corresponds to $Cu_6Sn_5$ or $Cu_3Sn$, for example.

Furthermore, in this case, the Cu layer 200 of the original bonding material 223 is partially changed to the second and third intermetallic compound layers 227d and 228c by the diffusion reaction, but the layer-shaped Cu layer 200 remains (FIG. 9B).

As a result of the above reactions, the mounted layers 232b includes the first intermetallic compound layer 227c, the Bi layer 229, the second intermetallic compound layer 227d, the Cu layer 200, the third intermetallic compound layer 228c, the Bi layer 230, and the fourth intermetallic compound layer 228d. This mounted layers 232b is apparently different in configuration from the mounted layers 232a.

In addition, the heating time is 15 minutes here, but the time is not limited to this, and the heating time may be within 45 minutes. As will be described below, when the heating time is within 45 minutes, Cu of the electrode 103 can be prevented from being oxidized and changed in color.

c) Formation of Mounted Structure 106

Figure 9C:
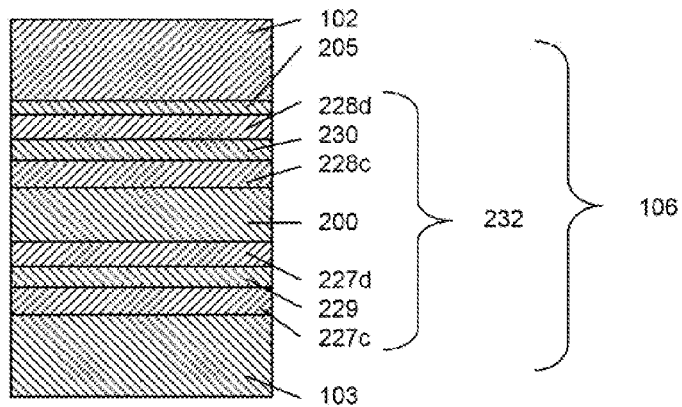

FIG. 9C is the schematic cross-sectional view of the mounted structure 106 completed after being naturally cooled down from the heated state in FIG. 9B to room temperature. By natural cooling from the heated state to room temperature, the mounted structure 106 in FIG. 9C can be obtained while the laminated state in FIG. 9B is maintained. In addition, the mounted layers 232 has roughly the same configuration as the mounted layers 232b, but when a high-temperature phase/low-temperature phase or the like depending on the temperature exist in each intermetallic compound, its composition partially changes in some cases.

For example, as shown in FIG. 9C, the electrode 103 and the electrode 205 of the semiconductor element 102 are bonded by the mounted layers 232. The mounted layers 232 includes the fourth intermetallic compound layer 228d in which the AgSn intermetallic compound and the CuSn intermetallic compound are mixed, the Bi layer 230, the third intermetallic compound layer 228c of the CuSn intermetallic compound, the Cu layer 200, the second intermetallic compound layer 227d of the CuSn intermetallic compound, the Bi layer 229, and the first intermetallic compound layer 227c of the CuSn intermetallic compound. In addition, the Cu layer 200 has an average thickness of 4.8 μm (average of measurements at N=10 points from observation of cross-sectional surfaces (5 points are measured in one cross-sectional surface, and measurements are taken in two cross-sectional surfaces)).

<Disappearance of First and Second Sn—Bi Layers, and Remains of Layer-Shaped Cu Layer and Bi Layer Characterized in Third Embodiment>

As shown in FIG. 9C, in the mounted structure 106 according to this third embodiment, among the first Sn—Bi layer 201, the Cu layer 200, and the second Sn—Bi layer 204 of the bonding material 223 described in FIG. 8, the first and second Sn—Bi layers 201 and 204 disappear. Meanwhile, the layer-shaped Cu layer 200 sandwiched between the second and third intermetallic compound layers 227d and 228c remains, so that ductility can be obtained in the mounted layers 232 due to the Cu layer 200. In addition, the Bi layer 229 sandwiched between the first and second intermetallic compound layers 227c and 227d and the Bi layer 230 sandwiched between the third and fourth intermetallic compound layers 228c and 228d remain, and low elasticity can be obtained due to the Bi layer 229 and the Bi layer 230.

Meanwhile, hypothetically, when it is assumed that the Sn—Bi layer is left in the bonding material to keep the ductility of the mounted layers, contrary to the above, heat resistance is lost at a heat generation temperature of 250° C. of the semiconductor element at the time of the operation of the power semiconductor module because a melting point of Sn—Bi is as low as 139° C. That is, in the case where the Sn—Bi layer remains, when the Sn—Bi remains in a shape of a layer, for example, a defect is possibly generated such that the semiconductor element and the electrode are shifted in position at the heat generation temperature of 250° C. of the semiconductor element.

Therefore, the inventor of the present invention has thought of leaving the Cu layer and the Bi layer instead of Sn—Bi. In this case, since Ag and Cu are widely used for the electrode, it is possible to think that Ag and Cu on the electrode side are to be left. In a case where the mounted layers between the electrode of the semiconductor element and the electrode of the substrate is totally formed of the intermetallic compound layer, sufficient ductility cannot be kept in the mounted layers itself even when the Cu layer is left on the electrode side. Then, it is not possible to prevent the crack generation in the semiconductor element, and the peeling between the semiconductor element and the mounted layers, due to the thermal stress. Thus, as shown in FIG. 9C, the inventor of the present invention has come up with the idea that the ductility is provided in the mounted layers 232 by leaving the layer-shaped Cu layer 200 sandwiched between the second and third intermetallic compound layers 227d and 228c, and the low elasticity is provided by leaving the Bi layers 230 and 229, and reached the configuration of the third embodiment.

<Calculation of Yield of Mounted Structure>

Here, with the mounted structure completed as described above, an yield of the mounted structure was confirmed in order to confirm the crack generation in the semiconductor element, and the interface peeling between the semiconductor element and the mounted layers. According to a method for confirming the yield of the mounted structure, the mounted structure was observed in an ultrasound image to check the crack generation in the semiconductor element, and the interface peeling between the semiconductor element and the mounted layers, and calculate the yield in which the crack generation and the peeling are less than 20% (N number=20) with respect to surface areas of the semiconductor element and the mounted layers.

A good/bad determination of the yield of the mounted structure is made such that in a case of 80% or more, it is determined to be ○ (non-defective), and in a case of less than 80%, it is determined to be x (defective), so that in the case of 80% or more (○), it is determined as a non-defective product. Since a yield of the mounted structure completed as described above is 100%, its determination is ○, that is, it is determined as the non-defective product.

The reasons why the crack generation in the semiconductor element, and the interface peeling between the semiconductor element and the mounted layers do not occur in this mounted structure are considered as follows.

In the mounted layers of this mounted structure, compared with the second intermetallic compound layer (upper layer) and the third intermetallic compound layer (lower layer), the Cu layer has the plastic deformability and the Bi layer has the low elasticity. Thus, since the Cu layer warps and the Bi layer relaxes the stress, it is considered to be able to prevent the crack generation in the semiconductor element or peeling between the semiconductor element and the mounted layers due to the thermal stress in the bonding process.

<Calculation of Product Yield>

Next, with the mounted structure completed as described above, the power semiconductor module was formed through wire bonding and shielding, and a product yield is calculated in order to confirm heat resistance required to be used as the power semiconductor module.

According to a method for confirming the product yield, the product was observed in an ultrasound image after 1000 hours had passed after a high-temperature storage test at 250° C. to determine the crack generation in the mounted structure, and the peeling, and calculate the product yield in which the crack generation and the peeling are less than 20% (N number 20) with respect to a surface area of the mounted layers.

A determination of the product yield is made such that in a case of 80% or more, it is determined to be non-defective indicated as a character of "○", and in a case of less than 80%, it is determined to be defective indicated as a character of "x". Then, in the case of 80% or more, it is determined as a non-defective product.

Since a product yield of the mounted structure completed as described above is 100%, its determination is indicated as a character of "○", that is, it is determined as the non-defective product.

The reasons why the crack generation and peeling do not occur in the mounted layers of this mounted structure are considered as follows.

As shown in FIG. 9C, melting points of the AgSn compound and the CuSn compound in the third and fourth intermetallic compound layers 228c and 228d in the mounted layers 232 are 480° C. or more, and 415° C. or more, respectively. In addition, a melting point of the CuSn compound in the first and second intermetallic compound layers 227c and 227d is 415° C. or more. Furthermore, a melting point of the Cu layer 200 is 1000° C. or more, and a melting point of the Bi layers 229 and 230 is 270° C. From the above, it is considered that the heat resistance is ensured because as for the heat resistance to 250° C. of heat generation at the time of the operation of the semiconductor element 102 when the power semiconductor module is used, the melting points of all components of the mounted layers 232 are higher than the above heat resistance criterion of 250° C.

In addition, according to the above configuration, as shown in FIG. 9C, the mounted layers 232 has the fourth intermetallic compound layer 228d in which the AgSn intermetallic compound and the CuSn intermetallic compound are mixed, the Bi layer 230, the third intermetallic compound layer 228c of the CuSn-based intermetallic compound, the layer-shaped Cu layer 200, the second intermetallic compound layer 227d, the Bi layer 229, and the first intermetallic compound layer 227c. When the semiconductor element 102 and the electrode 103 are bonded by the mounted layers 232, it is possible to achieve both of the prevention of the crack generation or the peeling between the semiconductor element and the mounted layers due to the thermal stress in the bonding process, and ensuring of the heat resistance to the heat generation of 250° C. of the semiconductor element at the time of the operation of the power semiconductor module, which could not be achieved by the conventional technique. As a result, the semiconductor element and the electrode of the substrate can be bonded with high quality, so that bonding reliability can be improved. Thus, it is considered that the mounted structure 106 in this third embodiment can solve the conventional problem.

<Relationship Between Thickness of Cu Layer and Thickness of Sn—Bi Layer in Bonding Material>

Next, the thickness of the Cu layer and the thicknesses of the first Sn—Bi layer and the second Sn—Bi layer in the bonding material were conformed, and the thicknesses were changed to confirm the prevention of the crack generation of the semiconductor element, or peeling between the semiconductor element and the mounted layers (peeling prevention), due to the thermal stress in the bonding process, and the heat resistance. Here, a level in which the Cu layer has a thickness of 0 μm corresponds to a conventional example.

Here, it is to be noted that, a time for holding the mounted layers under the condition, heated at 280° C. at the time of the bonding was limited to 45 minutes. This is because when the mounted layers is held under the heated condition at 280° C. for 45 minutes or more, a change in color is terrible due to oxidation of the Cu alloy of the electrode of the substrate, so that wire bonding and sealing cannot be performed in a post-process.

Table 1 shows the yield of the mounted structure calculated for the mounted structure bonded in the bonding process described in FIG. 7 while the thickness of the Cu layer of the Cu layer, and the thicknesses of the Sn—Bi layers of the first Sn—Bi layer and the second Sn—Bi layer are changed. In addition, Table 2 shows the product yield.

TABLE 1

| | | Thickness of Sn—Bi layer before bonding (μm) | | | | |
| --- | --- | --- | --- | --- | --- | --- |
| | | 5 | 10 | 15 | 20 | 30 |
| Thickness of Cu layer before bonding (μm) | 0 | X | X | X | Defective bonding | Defective bonding |
| | 5 | X | X | X | Defective bonding | Defective bonding |
| | 10 | X | X | X | Defective bonding | Defective bonding |
| | 15 | ◯ | ◯ | ◯ | Defective bonding | Defective bonding |
| | 30 | ◯ | ◯ | ◯ | Defective bonding | Defective bonding |
| | 50 | ◯ | ◯ | ◯ | Defective bonding | Defective bonding |
| | 100 | ◯ | ◯ | ◯ | Defective bonding | Defective bonding |

TABLE 2

| | | Thickness of Sn—Bi layer before bonding (μm) | | | | |
| --- | --- | --- | --- | --- | --- | --- |
| | | 5 | 10 | 15 | 20 | 30 |
| Thickness of Cu layer before bonding (μm) | 0 | ◯ | ◯ | ◯ | X | X |
| | 5 | Unadministered | Unadministered | Unadministered | X | X |
| | 10 | Unadministered | Unadministered | Unadministered | X | X |
| | 15 | ◯ | ◯ | ◯ | X | X |
| | 30 | ◯ | ◯ | ◯ | X | X |
| | 50 | ◯ | ◯ | ◯ | X | X |
| | 100 | ◯ | ◯ | ◯ | X | X |

According to a method for confirming the yield of the mounted structure, similar to the above-described method, the mounted structure was observed in an ultrasound image to determine the crack generation in the semiconductor element, and the interface peeling between the semiconductor element and the mounted layers, and calculate the yield in which the crack generation and the peeling is less than 20% (N number=20) with respect to surface areas of the semiconductor element and the mounted layers. According to the determination of the yield of the mounted structure, in a case of 80% or more, it is determined to be non-defective indicated as a character of '◯', and in a case of less than 80%, it is determined to be defective indicated as a character of "x", so that in the case of 80% or more ("◯"), it is determined as a non-defective product. Even when the determination of the yield is non-defective indicated as a character of "◯", it is determined as the defective bonding for a level in which Sn—Bi does not disappear completely in the bonding process in an analysis of the cross-sectional surface of the mounted structure.

Here, as for a level in which the determination of the yield of the mounted structure is defective indicated as a character of "x", the product yield is not necessarily confirmed, so that the determination is not made (except for a level corresponding to the conventional example). This is because the purpose is to confirm a level which satisfies both of prevention of the crack generation in the semiconductor element or peeling between the semiconductor element and the mounted layers due to the thermal stress, and the heat resistance, in the bonding process.

According to a method for confirming the product yield, similar to the above method, the product was observed in an ultrasound image after 100 hours had passed after a high-temperature storage test at 250° C. to determine the crack generation and the peeling in the mounted layers of the mounted structure, and calculate the product yield in which the crack generation and the peeling is less than 20% (N number=20) with respect to a surface area of the mounted layers. According to the determination of the product yield, in a case of 80% or more, it is determined to be non-defective indicated as a character of "◯", and in a case of less than 80%, it is determined to be defective indicated as a character of "x" so that in the case of 80% or more ("◯"), it is determined as a non-defective product.

It is found that a level in which the non-defective product is determined in the yield of the mounted structure in Table 1 (1) and the non-defective product is determined in the yield of the product in Table 2 (2), that is, the non-defective product is determined in each of them is satisfied in a case where the thickness of the Sn—Bi layer in the bonding material 223 falls within the range of 5 μm to 15 μm, and the thickness of the Cu layer in the bonding material 223 falls within the range of 15 μm to 100 μm. From the above, it is found that in order to ensure the stress relaxation property in the mounted layers, the thickness of the Cu layer in the bonding material needs to be 15 μm or more, and in order to ensure the heat resistance, the thickness of the Sn—Bi layer in the bonding material needs to be 15 μm or less.

Meanwhile, in the case where the thickness of the Cu layer is 0 μm, which corresponds to the conventional example, non-defective indicated as a character of "○" is determined in the yield of the product (2), but defective indicated as a character of "x" is determined in the yield of the mounted structure (1). That is, when the Cu layer is not contained in the bonding material, the Cu layer does not exist in the mounted layers of the mounted structure as a matter of course. Thus, when the Cu layer is not contained in the mounted layers of the mounted structure, the heat resistance can be provided, but the stress relaxation property is not provided, so that the heat resistance and the stress relaxation property cannot be provided at the same time. Thus, it can be confirmed that this third embodiment is superior to the conventional example.

<Relationship of Thicknesses of Cu Layer Before and after Bonding>

Next, a relationship between the thickness of the Cu layer in the bonding material before the bonding, and the thickness of the Cu layer in the mounted layers after the bonding were examined. This was made to find the thickness of the Cu layer which is actually needed for the stress relaxation after the bonding because the remaining Cu layer is reduced when Sn and Cu become the intermetallic compound by the diffusion reaction in the bonding material, in the bonding process.

As described above, FIG. 7B is the enlarged cross-sectional view of the Cu layer of the mounted structure. With reference to FIG. 7B, a description will be given of a method for measuring the thickness of the Cu layer in the mounted layers from the cross-sectional view of the mounted structure. First, as for the thickness of the Cu layer 200 sandwiched between the second intermetallic compound layer 227d and the third intermetallic compound layer 228c, a thinnest part is measured as the minimum thickness $t_{min}$, and a thickest part is measured as a maximum thickness $t_{max}$. Then, an average thickness is measured from certain points of N=10 points in the cross-sectional views (5 points are measured in one cross-sectional surface, and measurements are taken in two cross-sectional surfaces).

Figure 10:
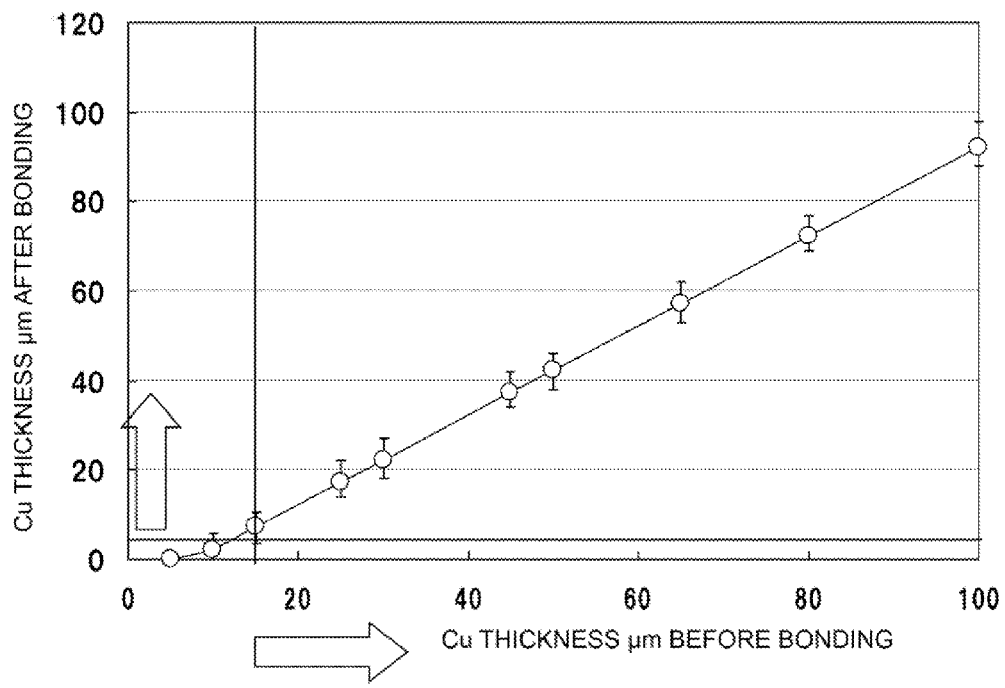
FIG. 10 is a graph showing a relationship between a thickness of a Cu layer of a bonding material before the bonding which is changed, and a thickness of the Cu layer of the mounted layers after the bonding, under the condition that a thickness of an Sn—Bi layer of the bonding material before the bonding is 15 µm.
Figure 11:
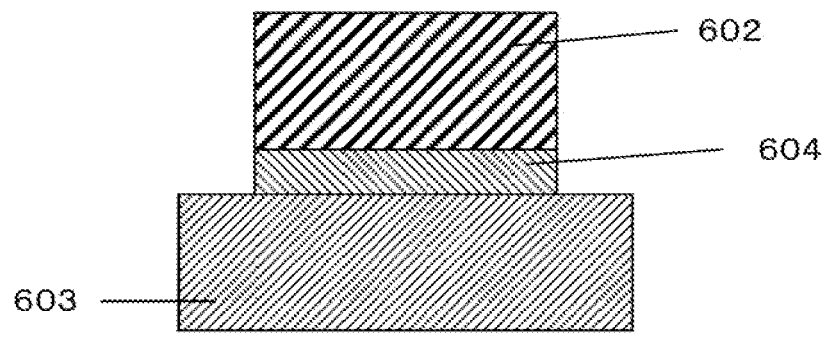
FIG. 11 is a cross-sectional view of a mounted layers of a conventional power semiconductor module.

FIG. 10 is a graph showing a relationship between the changed thickness of the Cu layer of the bonding material before the bonding, and the thickness of the Cu layer of the mounted layers after the bonding under the condition that the thickness of the Sn—Bi layer in the bonding material before the bonding is 15 μm.

It is found that from FIG. 10, in the case where the thickness of the Cu layer in the bonding material is 15 μm and the thickness of the Sn—Bi layer is 15 μm before the bonding, an average thickness of the Cu layer remaining in the mounted layers after the bonding is 7.2 m, and the minimum thickness $t_{min}$ is 3.7 μm. From this, it is considered that when the minimum thickness $t_{min}$ of the Cu layer in the mounted layers after the bonding is at least 3.7 μm or more, it is possible to achieve both of the prevention of the crack generation of the semiconductor element or peeling between the semiconductor element and the mounted layers due to the thermal stress, and the heat resistance, in the bonding process.

<Relationship with Area of Mount Plane>

Next, it was determined whether or not the crack generation of the semiconductor element or the peeling between the semiconductor element and the mounted layers occurred with respect to different thermal stresses in the bonding processes while the area of the mount plane with the electrode of the semiconductor element is changed. Table 3 shows a result that whether or not the crack generation of the semiconductor element or the peeing between the semiconductor element and the mounted layers occurs, with respect to the thickness of the Cu layer of the bonding material before the bonding and the thickness of the Cu layer of the mounted layers after the bonding, and the area of the mounted layers with the electrode of the semiconductor element.

TABLE 3

| Cu layer thickness μm | | Area of mount plane of semiconductor element (mm²) | | | | | | | | | |
|---|---|---|---|---|---|---|---|---|---|---|---|
| Before bonding | After bonding | 1 | 5 | 10 | 15 | 20 | 30 | 40 | 60 | 78 | 100 |
| 5 | 0 | ○ | X | X | X | X | X | X | X | X | X |
| 10 | 0 | ○ | X | X | X | X | X | X | X | X | X |
| 15 | 6.2 | ○ | ○ | ○ | ○ | ○ | ○ | ○ | ○ | ○ | ○ |
| 25 | 19 | ○ | ○ | ○ | ○ | ○ | ○ | ○ | ○ | ○ | ○ |
| 30 | 22 | ○ | ○ | ○ | ○ | ○ | ○ | ○ | ○ | ○ | ○ |
| 45 | 38 | ○ | ○ | ○ | ○ | ○ | ○ | ○ | ○ | ○ | ○ |
| 50 | 42 | ○ | ○ | ○ | ○ | ○ | ○ | ○ | ○ | ○ | ○ |
| 65 | 56 | ○ | ○ | ○ | ○ | ○ | ○ | ○ | ○ | ○ | ○ |
| 80 | 70 | ○ | ○ | ○ | ○ | ○ | ○ | ○ | ○ | ○ | ○ |
| 100 | 92 | ○ | ○ | ○ | ○ | ○ | ○ | ○ | ○ | ○ | ○ |

According to a determination method, when the crack generation of the semiconductor element or the peeling between the semiconductor element and the mounted layers does not occur, non-defective indicated as a character of "○" is determined, and the crack generation of the semiconductor element or the peeling between the semiconductor element and the mounted layers occurs, defective indicated as a character of "x" is determined.

Referring to Table 3, in a case where the area of the mount plane with the electrode of the semiconductor element is 1 mm² or less, even when the minimum thickness $t_{min}$ of the Cu layer of the mounted layers after the bonding is 0 μm, the crack generation of the semiconductor element or the peeling between the semiconductor element and the mounted layers does not occur. Meanwhile, in a case where the area of the mount plane with the electrode of the semiconductor element is 5 mm² or more, when the minimum thickness of the Cu layer of the mounted layers after the bonding is 0 μm, the crack generation of the semiconductor element or the peeling between the semiconductor element and the mounted layers occurs.

Referring to Table 3, in a case where the thickness of the Cu layer of the bonding material before the bonding is 15 μm or more, the Cu layer having plastic deformability exists in the form of a continuous layer shape, in the mounted layers of the mounted structure. Thus, as for the semiconductor element in which the area of the mount plane with the electrode of the semiconductor element is between 5 mm² and 10 mm², when the thickness of the Cu layer of the bonding material before the bonding is 15 μm or more, the Cu layer having the plastic deformability exists in the form of the layer shape, in the mounted layers of the mounted structure, so that the Cu layer warps in the mounted layers to which the thermal stress caused by a difference in linear expansion rate between the semiconductor element and the electrode is applied. Thus, it is considered to be able to prevent the crack generation of the semiconductor element or the peeling between the semiconductor element and the mounted layers due to the thermal stress in the bonding process.

(Variations)

According to the third embodiment, as shown in FIG. 8A, in the case where the Ag layer 205 is provided as the electrode 205 of the semiconductor element 102, and the Cu layer 103 is provided as the electrode 103 of the substrate 101, they are bonded with the bonding material 223 in which the first Sn—Bi layer 201, the Cu layer 200, and the second Sn—Bi layer 204 are sequentially arranged. In this case, as shown in FIG. 9C, after the bonding, the mounted layers 232 for bonding the electrode 205 of the semiconductor element 102 and the electrode 103 includes the first intermetallic compound layer 227c containing the CuSn-based intermetallic compound, the Bi layer 229, the second intermetallic compound layer 227d of the CuSn-based, the Cu layer 200, the third intermetallic compound layer 228c of the CuSn-based, the Bi layer 230, and the fourth intermetallic compound layer 228d containing the CuSn-based intermetallic compound as the main phase, and the AgSn-based intermetallic compound as the second phase.

Meanwhile, the present invention is not limited to the configurations of the first to third embodiments.

First, the electrode of the semiconductor element is not limited to the Ag layer, and it may be a Cu layer, Sn layer, Ni layer, or Au layer or may be formed such that a plurality of layers selected from the above are arranged.

In addition, the electrode of the substrate is not limited to the Cu layer, and it may be an Ag layer, Sn layer, Ni layer, or Au layer or may be formed such that a plurality of layers selected from the above are arranged.

Furthermore, the layer composing the bonding material is not limited to the above three layers of the first Sn—Bi layer, the Cu layer, and the second Sn—Bi layer. As the bonding material, it is only necessary to contain one Cu layer and one Bi layer. In addition, when the electrode of the substrate is not the Sn—Bi layer, the bonding material needs to further contain the Sn—Bi layer between the surface which comes in contact with the electrode of the substrate, and the Cu layer. This is because it is necessary to provide the Sn—Bi layer on at least one interface of the bonding material 223 and the electrode, in order to ensure the wettability at the interface between the bonding material and the electrode. In addition, when the electrode of the semiconductor element is not the Sn—Bi layer, the bonding material needs to further contain the Sn—Bi layer between the surface which is in contact with the electrode of the semiconductor element, and the Cu layer. This is because it is necessary to provide the Sn—Bi layer on at least one interface of the bonding material and the electrode in order to ensure the wettability at the interface between the bonding material and the electrode.

In addition, the thickness of the Cu layer needs to be equal to or more than the thickness of the adjacent Sn—Bi layer. This is a necessary condition to leave the layer-shaped Cu layer and Bi layer in the mounted layers after the bonding.

Table 4 shows cases of some variations corresponding to the above conditions.

TABLE 4

| | Electrode of semiconductor element side | Bonding material | Electrode of substrate side |
| --- | --- | --- | --- |
| Third embodiment | Ag | Sn—Bi/Cu/Sn—Bi | Cu |
| Variation 1 | Sn—Bi | Ag/Cu/Sn—Bi | Cu |
| Variation 2 | Sn—Bi | Ag/Cu | Sn—Bi/Cu |
| Variation 3 | Cu | Sn—Bi/Cu/Sn—Bi | Cu |
| Variation 4 | Cu/Sn—Bi | Cu/Sn—Bi | Cu |

TABLE 4-continued

| | Electrode of semiconductor element side | Bonding material | Electrode of substrate side |
| --- | --- | --- | --- |
| Variation 5 | Cu | Sn—Bi/Cu/Sn—Bi | Ag |
| Variation 6 | Ag | Sn—Bi/Cu/Sn—Bi | Ag |
| Variation 7 | Ni | Sn—Bi/Cu/Sn—Bi | Cu |
| Variation 8 | Ni/Au | Sn—Bi/Cu/Sn—Bi | Cu |
| Variation 9 | Au | Sn—Bi/Cu/Sn—Bi | Cu |
| Variation 10 | Cu | Sn—Bi/Cu/Sn—Bi | Ni |

As shown in Table 4, according to variations 1 to 10, the bonding material can be selected such that the Sn—Bi layer exists on each of the interface between the electrode of the semiconductor element and the bonding material, and the interface between the electrode of the substrate and the bonding material, and the Cu layer is sandwiched between the two Sn—Bi layers.

In addition, according to the above variations 1 to 10, similar to the third embodiment, Bi is contained in both of the interface between the bonding material and the electrode of the semiconductor element, and the interface between the bonding material and the electrode of the substrate. Instead of this, similar to the first or second embodiment, Bi may be contained only in one interface.

In addition, as shown in the variations 7 to 10, when Ni or Au is used as the electrode of the substrate and the electrode of the semiconductor element, the fourth intermetallic compound layer and the first intermetallic compound layer contain the CuSn-based intermetallic compound as a main phase, and an NiSn-based intermetallic compound and/or an AuSn-based intermetallic compound as a second phase. The NiSn-based intermetallic compound is $Ni_3Sn_4$, for example. In addition, the AuSn-based intermetallic compound is $AuSn_4$, for example.

In addition, as for a ratio of the thickness of each layer composing the bonding material, similar to the determination of the above example, it may be determined according to an yield of a mounted structure, and a yield of a product, based on an area of a mount plane with the semiconductor element after the bonding.

In the case of the variations 1 to 10 also, similar to the third embodiment, the mounted layers after the bonding includes a first intermetallic compound layer, a fourth intermetallic compound layer, a layer-shaped Cu layer sandwiched between second and third intermetallic compound layers, and Bi layer. Thus, similar to the third embodiment, heat resistance can be ensured to heat generation of the semiconductor element at the time of the operation of the power semiconductor module. In addition, it is possible to prevent crack generation of the semiconductor element or peeling between the semiconductor element and the mounted layers by ductility of the layer-shaped Cu layer of the mounted layers and low elasticity of the Bi layer with respect to a thermal stress in a bonding process. Thus, in the mounted structure according to each of the variations 1 to 10 also, it is possible to achieve both of the prevention of the crack generation of the semiconductor element or the peeling between the semiconductor element and the mounted layers due to the thermal stress, and the heat resistance, in the bonding process.

According to the mounted structure in the present invention, the mounted layers of the mounted structure includes the CuSn-based intermetallic compound layer, the Cu layer having the plastic deformability superior to the above intermetallic compound layer, and the low-elasticity Bi layer. Therefore, it is possible to achieve both of the heat resistance and the prevention of the crack generation of the semiconductor element or the peeling between the semiconductor element and the mounted layers, due to the thermal stress in the bonding process because the Cu layer warps and the Bi layer relaxes the stress. As a result, the present invention can be applied to usage for a semiconductor package such as a power semiconductor module or a small-power transistor.

DESCRIPTION OF REFERENCE SIGNS

100 Power semiconductor module
101 Substrate
102 Semiconductor element
103 Electrode
104 Mounted layers
106 Mounted structure
200 Cu layer
201 Sn—Bi layer
202 Sn layer
203, 213, 223 Bonding material
204 Second Sn—Bi layer
205 Electrode, Ag layer
206 Sn layer
207a, 207b Intermetallic compound layer
207c First intermetallic compound layer
207d Second intermetallic compound layer
208a 208b, Intermetallic compound layer
208c Third intermetallic compound layer
209, 209a, 209b Bi layer
212, 212a, 212b Mounted layers
217a, 217b Intermetallic compound layer
217c First intermetallic compound layer
218a, 218b Intermetallic compound layer
218c Second intermetallic compound layer
218d Third intermetallic compound layer
220a, 220b, 220 Bi layer
222 Mounted layers
227a, 227b Intermetallic compound layer
227c First intermetallic compound layer
227d Second intermetallic compound layer
228a, 228b Intermetallic compound layer
228c Third intermetallic compound layer
228d Fourth intermetallic compound layer
229a, 229b, 230a, 230b, 229, 230 Bi layer
232, 232a, 232b Mounted layers
602 Power semiconductor element
603 Electrode
604 Mounted layers

The invention claimed is:

1. A mounted structure comprising:
an electrode of a substrate;
an electrode of a semiconductor element; and
a mounted layers that bonds the electrode of the substrate and the electrode of the semiconductor element,
wherein the mounted layers includes along a direction from the substrate toward the semiconductor element:
a first intermetallic compound layer containing a CuSn-based intermetallic compound;
a Bi layer;
a second intermetallic compound layer containing a CuSn-based intermetallic compound;
a Cu layer; and
a third intermetallic compound layer containing a CuSn-based intermetallic compound.

2. The mounted structure according to claim 1, wherein the mounted layers further includes:
a Bi layer; and
a fourth intermetallic compound layer containing a CuSn-based intermetallic compound, and
the above layers are sequentially arranged between the third intermetallic compound layer and the electrode of the semiconductor element.

3. The mounted structure according to claim 1, wherein the CuSn-based intermetallic compound includes at least one intermetallic compound of $Cu_6Sn_5$ and $Cu_3Sn$.

4. The mounted structure according to claim 1, wherein the Cu layer has a thickness of 6.2 μm or more.

5. The mounted structure according to claim 4, wherein a mount plane between the mounted layers and the electrode of the semiconductor element has an area of between 5 $mm^2$ and 100 $mm^2$.

6. The mounted structure according to claim 1, wherein the first intermetallic compound layer contains the CuSn-based intermetallic compound, and includes an AgSn-based intermetallic compound.

7. The mounted structure according to claim 2, wherein the fourth intermetallic compound layer contains the CuSn-based intermetallic compound, and includes an AgSn-based intermetallic compound.

* * * * *